United States Patent [19]
Shimizu et al.

[11] Patent Number: 5,842,397
[45] Date of Patent: Dec. 1, 1998

[54] PUNCHING APPARATUS AND PUNCHING METHOD FOR CYLINDRICAL INNER SURFACE SCANNER

[75] Inventors: Yoshio Shimizu; Hiroshi Nomoto, both of Kyoto, Japan

[73] Assignee: Dainippon Screen Mfg. Co., Ltd., Japan

[21] Appl. No.: 847,875

[22] Filed: Apr. 28, 1997

Related U.S. Application Data

[63] Continuation of Ser. No. 386,431, Feb. 10, 1995, abandoned.

[30]     Foreign Application Priority Data

Feb. 14, 1994   [JP]   Japan ................................. 6-040478

[51] Int. Cl.$^6$ .................................................... B26F 1/08
[52] U.S. Cl. .......................... 83/54; 83/184; 83/185; 83/191; 83/948; 346/33 R; 346/138
[58] Field of Search .................... 346/33 R, 138, 346/146; 83/948, 949, 184, 185, 191, 54

[56]     References Cited

U.S. PATENT DOCUMENTS

| | | | |
|---|---|---|---|
| 3,689,932 | 9/1972 | Gerber | 346/29 |
| 4,260,998 | 4/1981 | Fukui | 346/138 X |
| 4,437,371 | 3/1984 | Howerton et al. | 83/54 |
| 4,500,285 | 2/1985 | Klotmann et al. | 432/103 |
| 4,637,710 | 1/1987 | Fujii et al. | 346/138 X |
| 4,723,134 | 2/1988 | Morita et al. | 346/138 |

FOREIGN PATENT DOCUMENTS

| | | |
|---|---|---|
| 5-5846 | 1/1993 | Japan . |
| 5-27190 | 2/1993 | Japan . |

*Primary Examiner*—M. Rachuba
*Attorney, Agent, or Firm*—Ostrolenk, Faber, Gerb & Soffen, LLP

[57]     ABSTRACT

A punching transport apparatus attached to an end surface a cylindrical inner surface drum includes two transport units which are connected with a pulse motor, two belts, and two pulleys so as to be able to move in synchronism to each other. The two transport units are linked to two punching units through linkage blocks. Transport carriers of the transport units are threadingly engaged with ball screws which are linked to the pulleys so that the transport carriers are loosely fitted to guide rails. Receiving an input signal which is entered in accordance with a plate edge distance which is determined by the specifications of a printer, a controller drives the pulse motor under the control of a pulse count. As a result, from an origin position which is determined in accordance with a condition which is detected by an origin sensor, the two transport units and the two punching units move in a central axis direction X.

12 Claims, 16 Drawing Sheets

PUNCHING APPARATUS AND PUNCHING METHOD FOR CYLINDRICAL INNER SURFACE SCANNER

This is a Continuation of application Ser. No. 08/386,431, filed on Feb. 10, 1995 now abandoned.

BACKGROUND OF THE INVENTION

1. Field of the Invention

The present invention relates to a punching apparatus and a punching method for a cylindrical inner surface scanner which is used for printing, plate making and etc.

2. Description of the Background Art

As disclosed in Japanese Patent Laid-Open Gazette Nos. 5-27190 and 5-5846, for instance, a cylindrical inner surface scanner is an image drawing apparatus comprising a cylindrical inner surface drum for mounting a photosensitive material on its inner surface, a laser oscillator for oscillating a light beam which is modulated by an image signal, an optical system for guiding the light beam into the cylindrical inner surface drum, and a scanning head which includes a deflector. The scanning head is disposed inside the cylindrical inner surface drum so as to be able to freely move in the direction of a central axis of the drum (i.e., in the subscanning direction). The deflector of the scanning head receives a light beam from the central axis direction of the drum and deflects the light beam toward the inner surface of the drum so that the light beam sweeps over the inner surface of the drum in a circumferential direction of the drum (i.e., in a main scanning direction). A film, a plate material, a photosensitive paper and the like are used as a photosensitive material in such a scanner. A plate material, once exposed and developed, can be directly set to a printer as a printing plate in which a half-tone dot image is formed. A typical example of a plate material is a PS plate (presensitized plate) for offset planagraphic printing. A PS plate is obtained by coating a plate material such as an aluminum plate and a plastic sheet with photosensitive fluid in advance.

After exposing a photosensitive material and drawing an image using this type of cylindrical inner surface scanner, holes which are required in the sake of subsequent printing must be punched in an edge portion of the photosensitive material. More exactly, a subsequent printing process uses a printer in which a printing plate is registered using a pin system. For easy understanding of this point, an explanatory diagram in FIG. 10 should be referred to which schematically shows a structure of a printer.

In FIG. 10, plate drums 57 to 60 each include a pin 55 in an outer surface. Although FIG. 10 shows only one pin for each drum, at least two pins are formed in each one of the plate drums 57 to 60 in reality. Using the pins 55 as reference positions, printing plates 51, 52, 53 and 54 for four colors, black (K), cyan (C), magenta (M) and yellow (Y) are each mounted onto a corresponding one of the plate drums 57, 58, 59 and 60, respectively. To this end, the printing plates 51 to 54 must include engaging holes to receive the pins 55. That is, the holes must be punched through within the cylindrical inner surface scanner prior to printing, i.e., at the same time with image drawing. An image must be drawn at the same position with respect to the punched holes for all plates. In FIG. 10, generally indicated at 50 is a printing paper, and the feeding direction of the paper 50 is indicated at 56.

To realize such a punching process inside the cylindrical inner surface scanner, conventionally, a groove is formed in the inner surface of the cylindrical inner surface drum near an end surface (or an edge portion) of the drum central axis direction, and a plurality of punching units are fitted in the groove and attached to the inner surface of the drum. Each punching unit includes a vertically movable punch which punches a hole in a photosensitive material. After a photosensitive material is mounted ont the cylindrical inner surface, a light beam is scanned in the main scanning direction by rotating the deflector while moving the scanning head in the central axis direction, or in the subscanning direction, thereby drawing an image on the photosensitive material. Following (or before) the drawing, holes are punched in using the punching units.

However, such a conventional technique has problems as follows. First, the conventional technique above does not consider a fact that "plate edge distance" is different between different types of printers. The plate edge distance is a distance between an edge of a photosensitive material which is nearest the punched holes and the center of each hole as shown in the plan view of FIG. 11A. In FIG. 11A, the direction X is the central axis direction of the cylindrical inner surface drum, i.e., the subscanning direction, the direction Y is the circumferential direction of the cylindrical inner surface drum, namely, the main scanning direction, and the symbol xd is a plate edge distance. Although shown as long oval holes in FIG. 11A, some or all of holes 20 may be circular holes. Alternatively, notches as those shown in FIG. 11B may be used instead of the long oval or circular holes 20 of FIG. 11A. In FIG. 11B, a notch 20A is rectangular and a notch 20B is round-shaped. The plate edge distance xd associated with the rectangular notch 20A is measured from the center of a circle inscribed with the three sides of the rectangle to an edge 19a of the plate. In a similar manner, the plate edge distance xd associated with the round-shaped notch 20B is measured from the center of a circle inscribed with the three sides of an imaginary rectangle of FIG. 11B to the edge 19a of the plate. Thus, punched holes may have various configurations as far as the plate edge distance xd is defined in advance. For this reason, the plate edge distance xd must be set dependent on the specifications of a printer which is used in subsequent printing.

However, since the punching units are fixed to the inner surface of the drum in the conventional technique as mentioned above, when the plate edge distance xd is changed to use a particular printer, the position of the photosensitive material fed and mounted onto the drum inner surface must be accurately adjusted in the central axis direction X. Furthermore, the conventional technique require that an operator manually inserts a photosensitive material into the scanner. Here, it is to be remembered that insertion of a photosensitive material is an operation which must be performed inside the cylindrical inner surface drum. That is, an operator must adjust the position of a mounted photosensitive material every time the specifications of a printer to be used for subsequent printing are changed. In this respect, such positional adjustment of the photosensitive material is not only physically hard for the operator but also inefficient. Moreover, it is extremely difficult to manually perform such minute positional adjustment. For this reason, in reality, the conventional technique cannot deal with a change in the plate edge distance xd.

One possibility is to use an automatic adjustment mechanism. With an automatic adjustment mechanism inside the cylindrical inner surface drum, it is possible to automatically move a photosensitive material placed on the drum inner surface and to adjust the position of the photosensitive material accurately. However, such a mechanism which is capable of performing minute adjustment of the mounting position of a photosensitive material is large and complex, and unpractical in terms of a cost. An automatic adjustment mechanism is not practical or desirable not only for this reason but also because space constraint due to the presence of other mechanisms such as the scanning head inside the drum. In short, an automatic adjustment mechanism is not a solution of the problem.

Another possibility is to form a plurality of grooves in the inner surface of the cylindrical inner surface drum. It is possible to change the plate edge distance xd by fixedly fitting punching units in an appropriate selected one of the grooves depending on a need. In this approach, it is not necessary to change the mounting position of a photosensitive material. Nevertheless, this approach is not desirable since it is extremely difficult to form a plurality of grooves at very small intervals although minute positional adjustment is impossible but for such very small intervals. In reality, the intervals are never smaller than a positional shift which is definitely needed. For this reason, precise adjustment of the plate edge distance xd is difficult. Further, this approach provides virtually no improvement over the conventional technique since an operator must manually change the fitting positions of the punching units. Again, this is not a solution of the problem.

The second problem of the conventional technique is an occasional reduction in an effective drawing area. This is attributed to the structural constraint that the punching units are fixed to the inner surface of the drum. FIGS. 12, 13A and 13B should be referred to for an understanding of this problem.

FIG. 12 is a view illustrating the second problem of the conventional technique. In this explanatory diagram, a positional relation between a punching unit 31 and a scanning head 32 is schematically shown. In FIG. 12, the punching unit 31 is fixed in an end portion of an inner surface 2 of a cylindrical inner surface drum 1 as viewed along the drum central axis direction (Engagement with a groove is omitted for simplicity), and a photosensitive material 19 is mounted on the inner surface 2 at a designated position. Here, for each of understanding, the first problem of the conventional technique is not taken into consideration. The scanning head 32 includes a deflector 33 which rotates about the central axis of the cylindrical inner surface drum 1. Due to rotation of the deflector 33, a light beam LB sweeps over a free surface (to be exposed) of the photosensitive material 19 in the main scanning direction Y.

The scanning head 32 is moved by a transport mechanism (not shown) in the central axis direction, that is, in the subscanning direction X. As a result, the light beam LB sweeps over the free surface (to be exposed) of the photosensitive material 19 in the subscanning direction X as well. Here, an area in which the scanning head 32 can draw an image in the subscanning direction X, i.e., an effective drawing area of the subscanning direction X is virtually limited by the presence of the punching unit 31 as shown in FIG. 12. More exactly, since the punching unit 31 is disposed above the end portion of the photosensitive material 19 in which a hole 20 is to be punched through, even the scanning head 32 arrives above this end portion, the end portion can not be exposed entirely and a dead area 30 is created in which the photosensitive material 19 is not exposed. In short, the effective drawing area of the subscanning direction X is reduced to an area AR in which the punching unit 31 is not present. Thus, the conventional technique can not avoid a reduction in the effective drawing area. This could be a serious problem depending on the type of the photosensitive material 19.

The plan views in FIGS. 13A and 13B illustrate this problem. FIG. 13A shows the photosensitive material 19 which is suitable to so-called business form printing while FIG. 13B shows the photosensitive material 19 which is suitable to so-called sheeted offset printing. In the case of a business form sheet of FIG. 13A, a hole 20 must be punched through immediately next to an exposure border 35a of an exposure are 35. For instance, a distance between the center of the hole 20 and the exposure border 35a is about 7.5 mm, and a distance between the center of a tip of the punching unit 31 and the blade of the punching unit 31 which is closest to the edge of the business form sheet is 11.5 mm. Hence, the exposure area 35 extends into the dead area 30, which makes it impossible to entirely expose the exposure area 35. In short, the very punching unit 31 serves an obstacle to image drawing. In contrast, in the case of FIG. 13B, since the hole 20 is formed sufficiently away from the exposure border 35a of the exposure area 35, the exposure area 35 is outside the dead area 30. Therefore, the punching unit 31 never obstructs image drawing.

An easy solution of this problem is to detach the punching unit 31 from the inner surface 2 during image drawing and to fit the punching unit 31 in a groove again prior to punching of holes. However, this results in the previous problem. That is, detaching and attaching of the punching unit 31 for every photosensitive material is not only inefficient in terms of labor required but also impractical due to the spatial constraint of the cylindrical inner surface drum 1.

These problems also exist where the photosensitive material 19 is a film. That is, to expose a film in the cylindrical inner surface scanner, it is necessary to punch registration holes in the film at such positions which are in predetermined positional relation with pins of a printer.

SUMMARY OF THE INVENTION

The present invention relates to a punching apparatus for use in a cylindrical inner surface scanner in which a scanning head is moved within an effective drawing area in a central axis direction of a cylindrical inner surface drum so that a light beam from the scanning head which is modulated by an image signal sweeps over an inner surface of the cylindrical inner surface drum in a circumferential direction of the cylindrical inner surface drum, thereby exposing a photosensitive material which is mounted on the inner surface and drawing an image on the photosensitive material, the punching apparatus comprising: a punching unit including a punch for punching a hole in the photosensitive material; punching unit transport means attached to an end portion of the cylindrical inner surface drum of the central axis direction, the punching unit transport means moving the punching unit in the central axis direction; and control means for controlling the punching unit transport means so that the punching unit is moved on the central axis direction in accordance with a plate edge distance, which is a distance between one end of the photosensitive material which is approximately parallel to the circumferential direction and a punching position which is determined in relation to a subsequent process, thereby registering the punch to the punching position. In the punching apparatus of the present invention, the punching unit transport means moves the punching unit in the central axis direction of the cylindrical inner surface drum until the punching unit is registered with the punching position which is determined by the plate edge distance, and the punching unit thereafter punches a hole in a photosensitive material at this punching position which is determined in relation with a subsequent process. When the plate edge distance is changed in relation with the subsequent process, the punching unit transport means again moves the punching unit to a new punching position which is determined by the new plate edge distance, and the punching unit thereafter punches a hole in a photosensitive material at the new punching position which is determined in relation with the subsequent process.

Preferably, the punching apparatus further comprises a position register plate which is fixed to the transport member so as to come into contact with an end of the photosensitive material which is mounted on the inner surface of the cylindrical inner surface drum. The control means controls the drive source to move the position register plate in the central axis direction so that the photosensitive material is pushed back toward the cylindrical inner surface drum and the position of the photosensitive material is adjusted.

The control means moves the punching unit outside the effective drawing area during image drawing. Hence, it is possible to draw an image always within the effective drawing area without obstruction by the punching unit.

Here, it is to be noted that "a cylindrical inner surface drum" as herein used refers to a drum which has an inner surface of a cylindrical configuration. An outer surface of the drum may not be cylindrical.

Accordingly, a first object of the present invention is to obtain a punching apparatus for a cylindrical inner surface scanner with easily deal with a change in a plate edge distance.

A second object the present invention is to obtain a punching apparatus for a cylindrical inner surface scanner in which it is possible to draw an image always within an effective drawing area and it is possible to punch holes in a desirable manner even when a plate edge distance is changed.

A third object of the present invention is to obtain a punching apparatus for a cylindrical inner surface scanner with which it is possible to accurately mount a photosensitive material on an inner surface of a cylindrical inner surface drum and it is possible to punch holes in the photosensitive material without adjusting the position of the photosensitive material.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
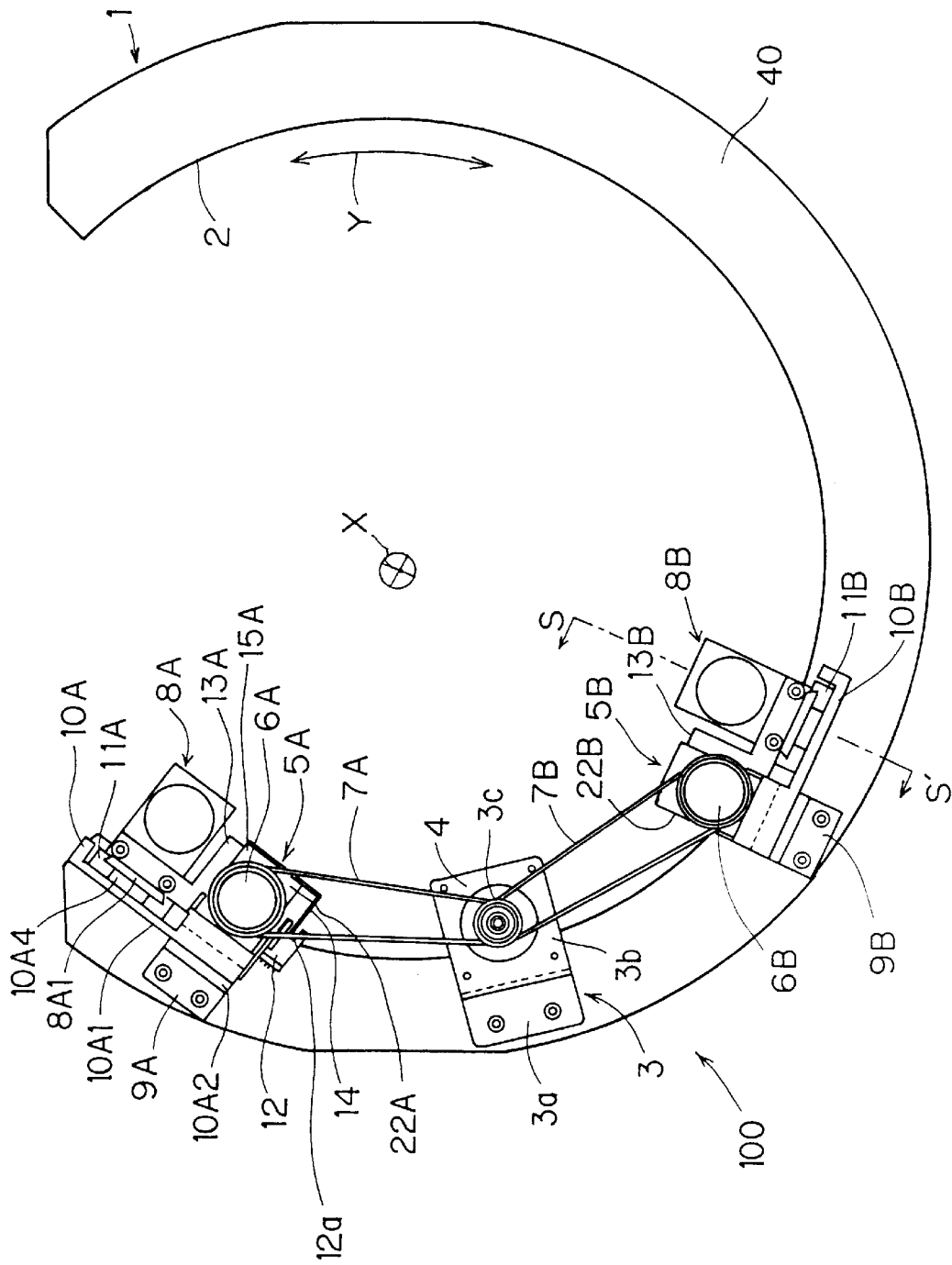
FIGS. 1 and 2 are a front view and a perspective view of an assembly of a punching unit and a punching unit transport apparatus, respectively.

FIG. 1 is a front view of an end surface 40 of a cylindrical inner surface drum 1 of a cylindrical inner surface scanner of a central axis direction X of the drum 1. FIG. 1 shows not only the cylindrical inner surface scanner but also a punching apparatus which is comprised of a punching unit transport apparatus 100 and punching units 8A and 8B which are disposed within the apparatus 100. The punching units 8A and 8B, or "punching unit(s) 8" when referred to as collectively, are identical in structure to each other.

FIG. 1 is a perspective view of the cylindrical inner surface drum 1, the punching unit transport apparatus 100 and the punching units 8A and 8B. The front view in FIG. 1 corresponds to FIG. 2 as it is viewed from the direction of an arrow 41. Although the punching unit transport apparatus 100 is attached to the end surface 40 at different positions between FIGS. 1 and 2, this is only for convenience of illustration.

Figure 4:
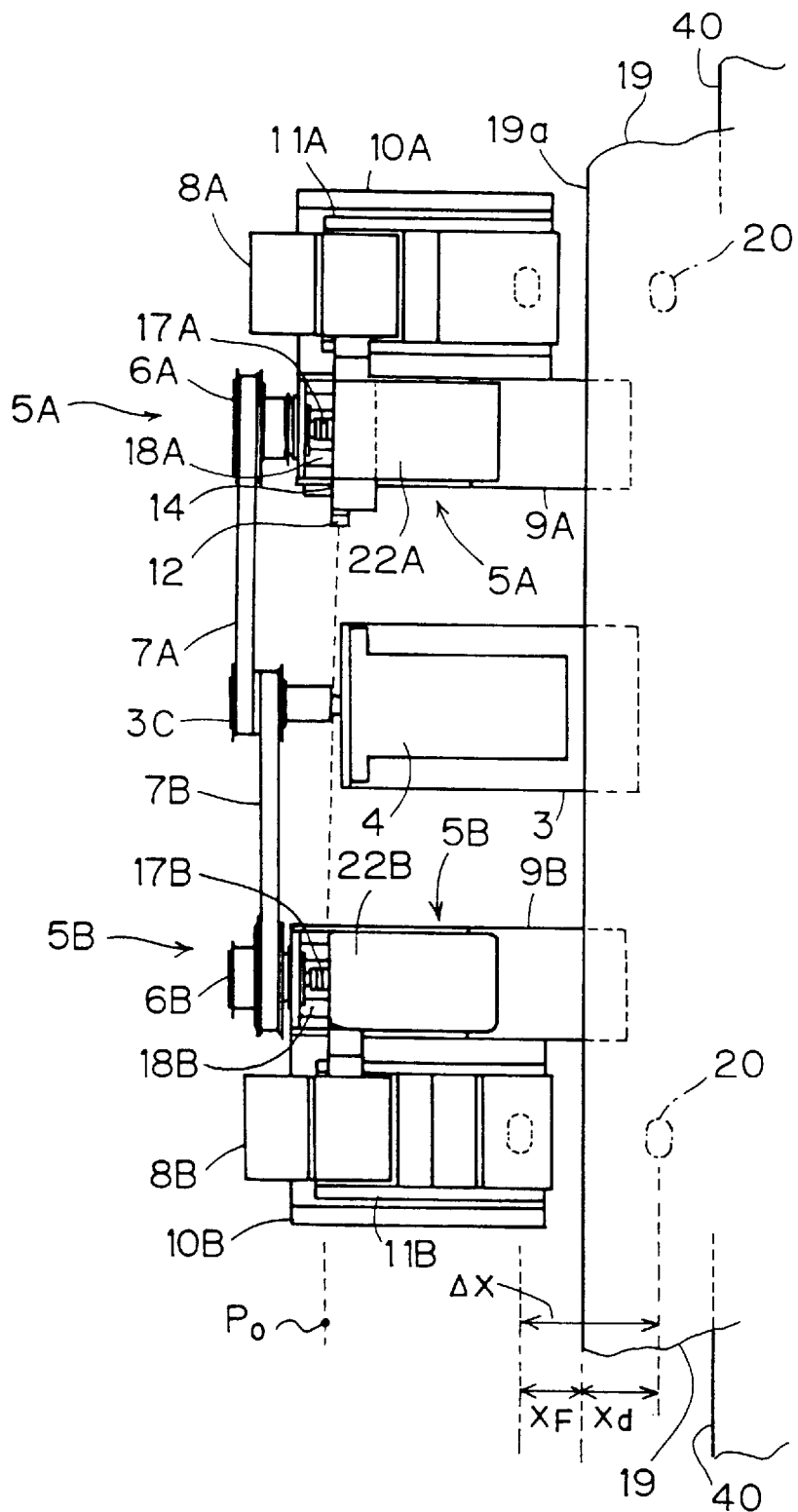
FIG. 4 is a plan view of the punching unit and the punching unit transport apparatus in an origin position.
Figure 5:
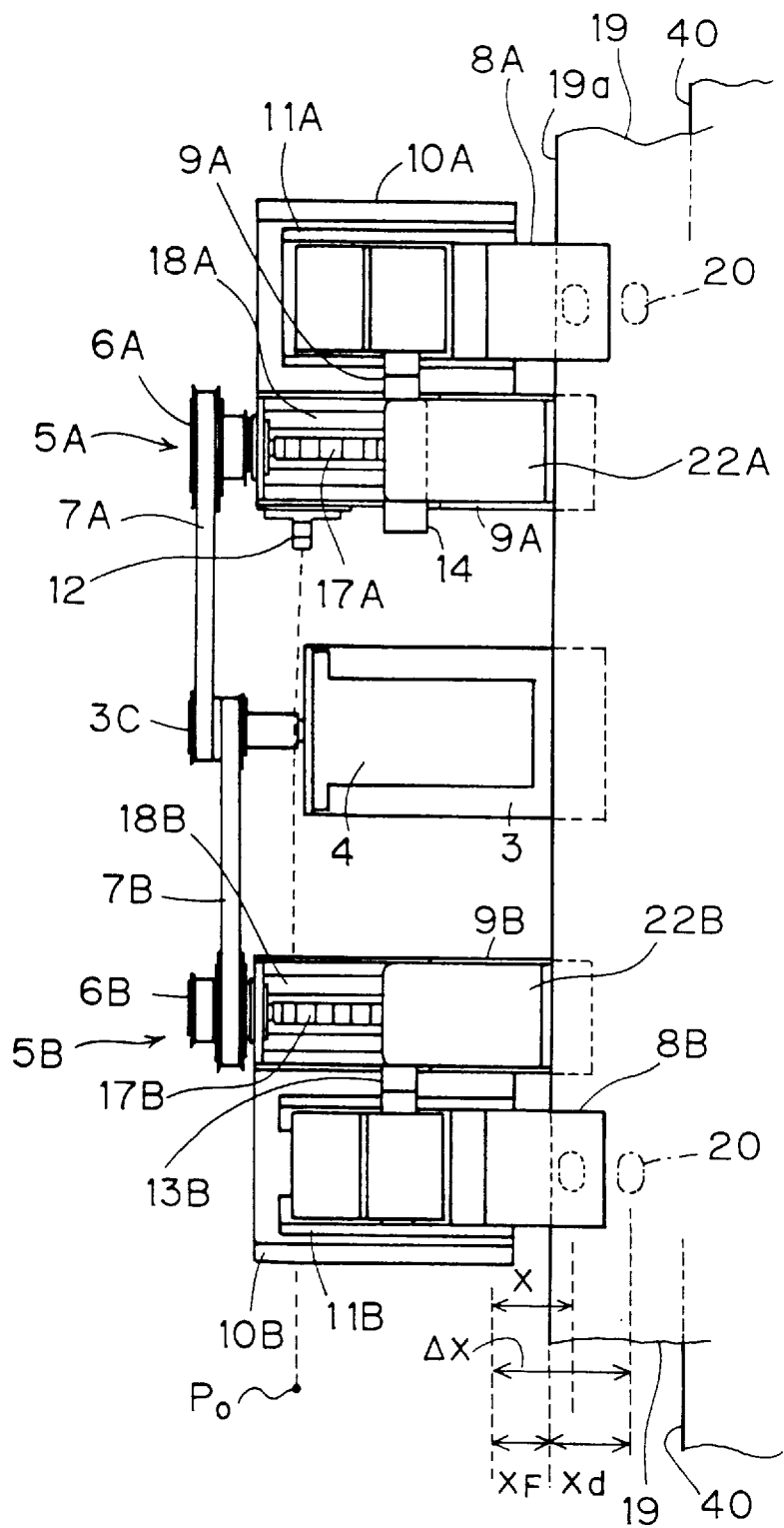
FIG. 5 is a plan view of the punching unit and the punching unit transport apparatus as they are moving.
Figure 6:
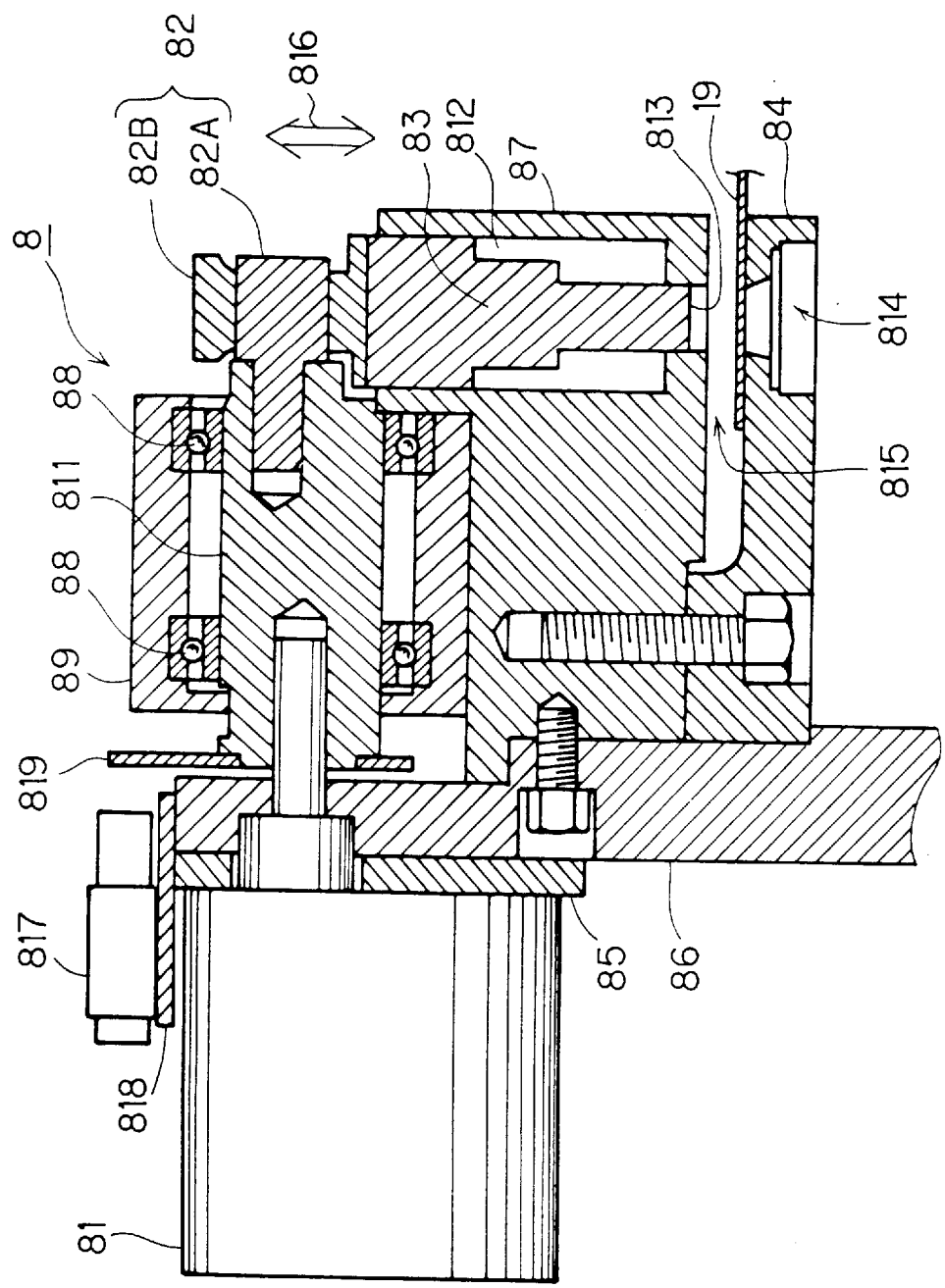
FIG. 6 is a cross sectional view of the punching unit along line 5–5' of FIG. 1.

Structures of the punching unit transport apparatus 100 and the punching unit 8 will be described with reference to FIGS. 1 and 2 as well as plan views in FIGS. 3 to 5. FIG. 3 is a side view of the punching unit transport apparatus 100, while FIGS. 4 and 5 are plan views of the punching unit 8 and the punching unit transport apparatus 100 as viewed from the direction of an arrow 42 of FIG. 2. FIGS. 4 and 5 show a photosensitive material 19 mounted onto an inner surface 2 of the cylindrical inner surface drum 1 so as to project from the end surface 40. In particular, FIG. 4 shows the punching units 8A and 8B, when retrieved to an origin position $P_0$ as described later. FIG. 5 shows the punching unit 8 as it is when its punch 83 as shown in FIG. 6 is moving above a punching position.

The punching unit transport apparatus 100 is an apparatus for moving the punching unit 8 in the central axis direction X of the cylindrical inner surface drum 1 in accordance with a plate edge distance xd. The punching unit transport apparatus 100 generally includes a pulse motor 4 and transport units 5A and 5B.

The pulse motor 4 (hereinafter referred to as "motor 4"), a drive source for moving the punching unit 8 in the central axis direction X, is controlled by a controller 26 (FIG. 7) as described later. The motor 4 is attached to the end surface 40 by bolting one fixing face 3a of a bracket 3 to the end surface 40 and fixing the other fixing face 3b of the bracket 3 to the motor 4 as shown in FIG. 1. A top of the rotary shaft of the motor 4 is linked to a pulley 3c about which belts 7A and 7B are stretched.

The transport units 5A and 5B, driven by the motor 4, each directly moves each punching unit 8 in the central axis direction X. Key structural elements of the transport units 5A and 5B are transport carriers 22A and 22B, respectively, which are linked to the punching unit 8. The transport unit 5B is different from the transport unit 5A in two points. First, the transport unit 5B does not include an origin sensor 12 and a vane 14. Second, the punching unit 8B is linked to the transport carrier 22B in an inverse relation from that of the transport unit 5A. Since the transport unit 5B is otherwise the same as the transport unit 5A, a description will be given mainly on the transport unit 5A.

The transport unit 5A is attached to the end surface 40 through an L-shaped bracket 9A. See FIGS. 1 and 2. More particularly, one side surface of the bracket 9A is bolted to the end surface 40, and a lower face 10A1 of a base block 10A of the transport unit 5A is bolted to the other surface of the bracket 9A. the transport unit 5A mounted on the base block 10A is formed by the following components.

That is, a fixing plate 1A is secured to a projection 10A2 (FIG. 1) of the base block 10A near an edge of the base block 10A. A transmission shaft is fitted through a hole which is formed in the center of the fixing plate 15A, and a pulley 6A is linked to a top of the transmission shaft. A belt 7A is stretched about the pulley 6A and a pulley 3c of the motor 4. An L-shaped fixing plate 16A is fixed to a protrusion 10A3 formed in the center of the base block 10A. See FIGS. 2 and 3. Between a side surface of the fixing plate 16A and the fixing plate 15A, two guide rails 18A, FIGS. 4 and 5, are disposed parallel to the central axis direction X. The transmission shaft linked to the pulley 6A is also linked to a ball screw 17A, FIGS. 4 and 5. The ball screw 17A is attached at an end to a center portion of the fixing plate 16A so as to be parallel to the central axis direction X. The transport carrier 22A is threadingly engaged with the ball screw 17A, and the two guide rails 18A are each loosely fitted with the transport carrier 22A. Hence, when the motor 4 rotates, rotation force of the motor 4 is transferred to the ball screw 17A through the belt 7A and the pulley 6A, thereby moving the transport carrier 22A in the central axis direction X along the guide rails 18A.

An L-shaped sub position register plate 221A is also fixed to the transport carrier 22A as shown in FIG. 3. When the transport carrier 22A moves in the central axis direction X in the manner above, the sub position register plate 221A also moves in the central axis direction X, which makes it possible to push the photosensitive material 19 back into the cylindrical inner surface drum 1.

Two guide rails 11A are disposed in a recess 10A, FIG. 1. A fitting portion 8A1 fixed to a lower portion of the punching unit 8A is loosely fitted in a slit space between the two guide rails 11A for free sliding movement. The lower portion of the punching unit 8A and a side surface of the transport carrier 22A are linked to each other by a linkage block 13A. Hence, as the transport carrier 22A moves in the central axis direction X with rotation of the motor 4, the punching unit 8 accompanies the transport carrier 22A to slide or move in the central axis direction X along the guides rails 11A.

Figure 2:
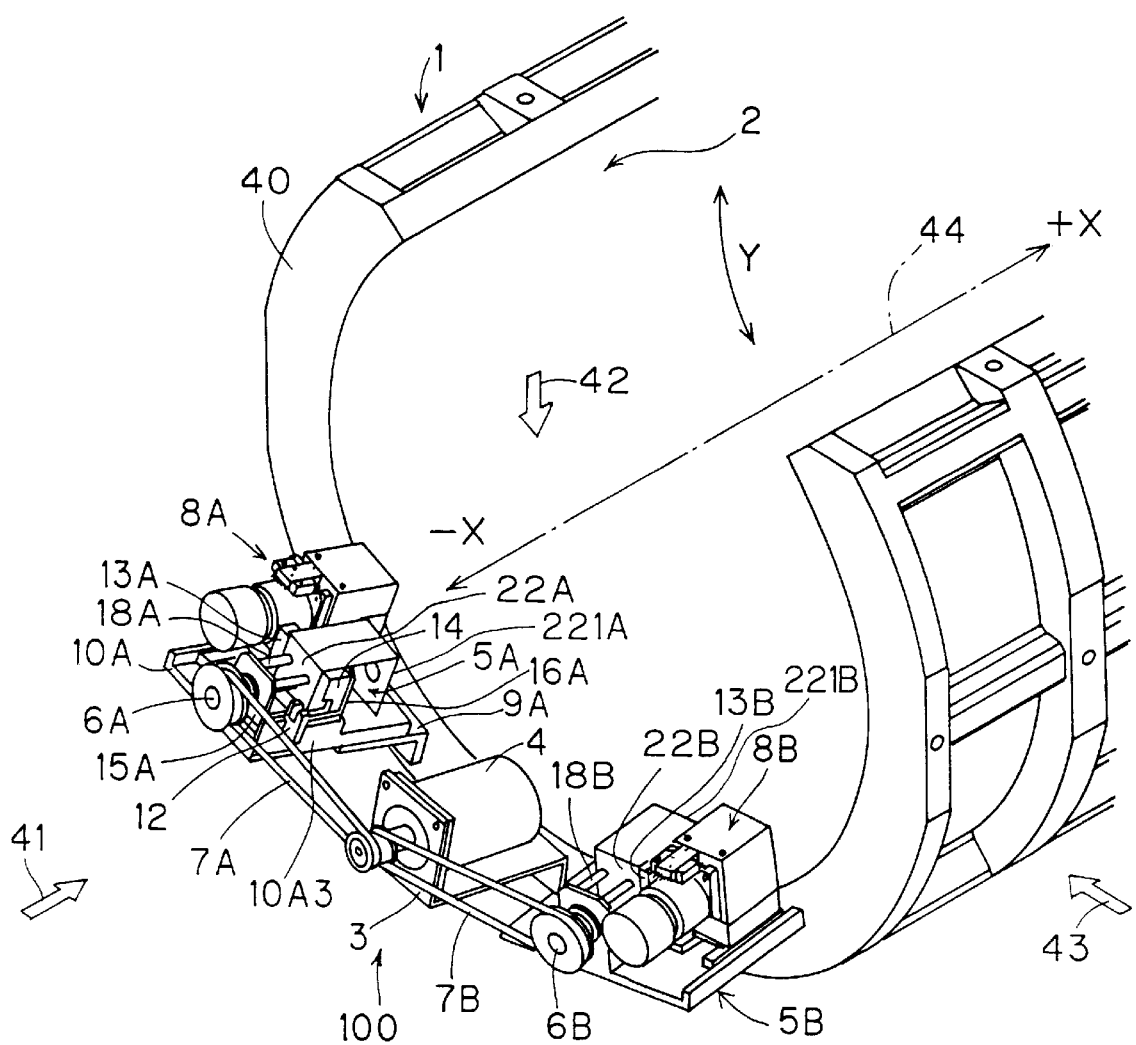
Figure 3:
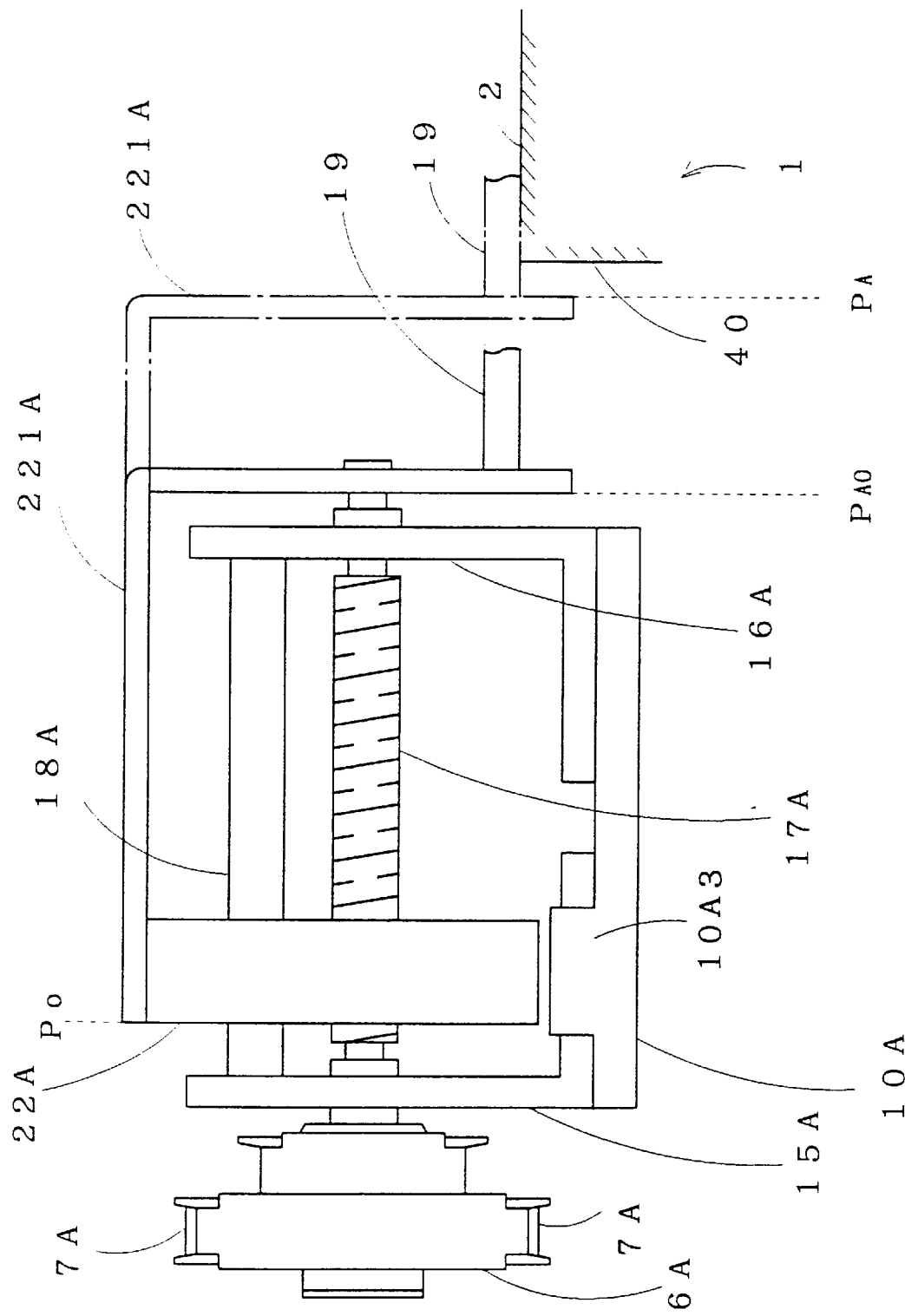
FIG. 3 is a side view of the punching unit transport apparatus of FIG. 1.

On the other hand, the origin sensor 12 is disposed to the side surface of the protrusion 10A3 of the base block 10A, FIGS. 2 and 3, near an edge of the fixing plate 15A side. The origin sensor 12 includes a light emitting element (e.g., LED) in one of the two opposed projecting portions which define a recess 12a (FIG. 1). In the other one of the two opposed projecting portions which define the recess 12a, the origin sensor 12 includes a light detector (e.g., photo diode) which detects light emitted from the light emitting element. An output terminal of the light detector is connected to the controller 26 of FIG. 7. As shown in FIGS. 1 and 2, since the vane 14 is attached to the transport carrier 22A, the van 14 moves with the transport carrier 22A in the central axis direction X. As the vane 14, accompanying the transport carrier 22A, passes in front of the recess 12a of the origin sensor 12, light emitted from the light emitting element is blocked by the vane 14 and an output signal of the light detector, namely, an output signal of the origin sensor 12 changes. The change is detected by the controller 26. The "origin position $P_0$" is the position of the transport carrier 22A, i.e., the punching unit 8A in the central axis direction X of this time point. In this respect, the origin sensor 12 is a sensor for detecting whether the punching unit 8A is at the origin position. Since only one such origin sensor 12 may be attached to the transport unit 5A, the transport unit 5B does not include the origin sensor 12 as mentioned earlier. It is also to be noted that the origin position is not only a reference position which is referred to in moving the punching unit 8 in the central axis direction X, but also is a retrieve position of the punching unit 8 during exposure.

When the punching unit 8A is at the origin position $P_0$, the sub position register plate 221A is at a position $P_{A0}$ in FIG. 3. The photosensitive material 19 is fed into the inner surface 2 so that its end is registered with the position $P_{A0}$ from the beginning.

For the transport unit 5B as well, the belt 7B is stretched around the pulleys 3c and 6B. Hence, in synchronism with rotation of the motor 4, the transport units 5A and 5B and the punching units 8A and 8B all move the same travel amount Δx in the central axis direction X, thereby moving the sub position register plate 221 and returning the photosensitive material 19 back into the cylindrical inner surface drum 1.

The structure and operation of the punching unit 8 is described in detail with respect to FIG. 6. FIG. 6 is a vertical cross sectional view of the punching unit 8 taken along the line S–S' of FIG. 1. Only principal components are shown in FIG. 6. The punching units 8 each include a motor 81, a cam mechanism 82, a punch 82 and a die 84 as key structural components. The motor 81 is attached to a bracket 86 of the punching unit 8 through a motor bracket 85. A punching block 87 is bolted to the bracket 86. A rotation shaft of the motor 81 is fitted in a central portion of a shaft 811 which is axially supported by a bearing mechanism 89 which includes two bearings 88. Thus, a central axis of the rotation shaft of the motor 81 coincides with a central axis of the shaft 811. On the other hand, an axis of an eccentric cam 82A of the cam mechanism 82 is fitted in the shaft 811 at a position deviated from the central axis of the shaft 811. That is, the axis of the eccentric cam 82A is deviated from the rotation shaft of the motor 81. Further, a follower 82B is linked to the eccentric cam 82A through an oval hole, not shown in FIG. 6, whereby the cam mechanism 82 is formed. The punch 83 penetrates a through hole 812 which is formed in the punching block 87 in such a manner that a top end of the punch 83 is linked to the follower 82B. The die 84 is bolted to a lower surface side of the punching block 87. A die hole 814 is formed in a tip portion of the die 84 so as to allow a tip portion 813 of the punch 83 to be inserted into the die hole 814. The photosensitive material 19 is mounted onto the die 84 so that an end of the photosensitive material 19 arrives at a space 815 which is created between the punching block 87 and the die 84.

Having such a structure, the punching unit 8 operates in the following manner. When the motor 81 is driven by a motor driver not shown, rotation force of the motor 81 is transferred to the eccentric cam 82A through the shaft 811 so that the eccentric cam 82A rotates about the central axis of the shaft 811 but at a position which is deviated from the central axis of the shaft 811. Driven by the eccentric rotation, the follower 82B starts moving in a vertical direction, i.e., in the direction indicated by an arrow 816 in FIG. 6. In this manner, the eccentric cam 82A converts the rotation force of the motor 81 into driving force of the vertical direction.

Acted upon by the driving force, the punch 83 moves downward from above, that is, from the free surface side, which is the surface to the exposed side of the photosensitive material 19, towards the mounting surface side of the photosensitive material 19 to punch through an end portion of the photosensitive material 19 which is placed on the die 84. The photosensitive material 19 is punched through and cutouts of the punched photosensitive material 19 fall downward through the die hole 814. The tip portion 815 of the punch 83 may be in the shape of a circular hole or an oval long hole.

A reflection type optical sensor 817 is secured to the brackets 85 and 86 through an intervening support plate 818 to confirm vertical movement of the punch 83. A deformed disk plate 819 is fixed to an end of the shaft 811 in a faced relation with the bracket 86 in such a manner that the center of the deformed disk plate 819 is on the central shaft of the eccentric cam 82A. Hence, the deformed disk plate 819 rotates in synchronism with rotation of the eccentric cam 82A. Utilizing rotation of the deformed disk plate 819, the optical sensor 817 detects vertical movement of the punch 83. A detection signal generated by the optical sensor 817 indicates whether punching by the punch 83 is complete. The detection signal is outputted to a controller 26 of FIG. 7. In accordance with detection signals $V_{PA}$ and $V_{PB}$, controller 26 controls insertion of the photosensitive material 19 onto and removing of the photosensitive material 19 from the inner surface 2.

Figure 7:
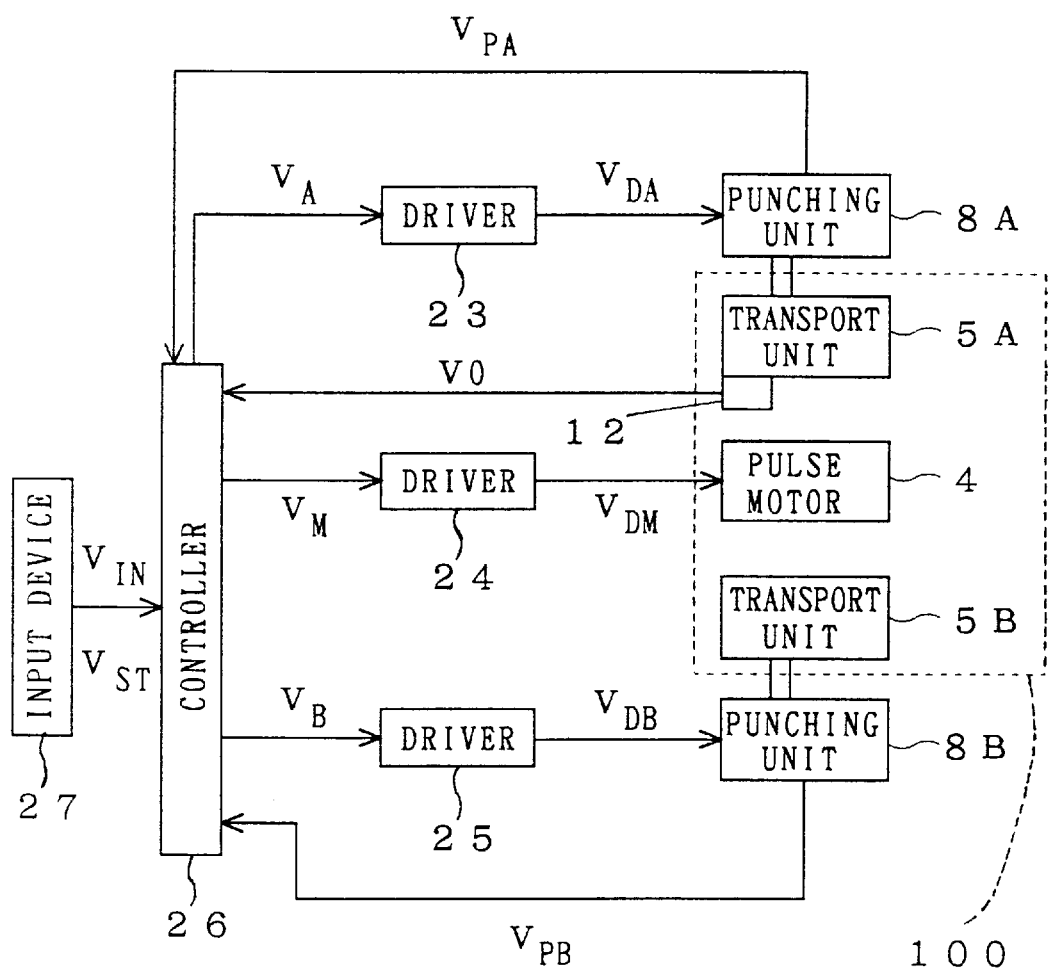
FIG. 7 is a block diagram of a control system of the punching unit transport apparatus.

FIG. 7 is a block diagram of a control system of the punching unit apparatus which is formed by the punching unit 8 and the punching transport apparatus 100. An interface circuit is omitted. The controller 26 is a main component of this control system. Although not shown in FIG. 7, the controller 26 includes a CPU part, a memory part, a counter part and etc. The CPU part reads a data signal from the memory part, processes various signals which are inputted from outside, and determines or outputs various control signals. The memory part stores a data signal which expresses a travel amount Δx of the punching unit 8 from the origin position $P_0$ in the central axis direction X and a data signal which expresses a relation between the travel amount Δx and a pulse count n which is necessary to drive the motor 4.

An input device 27 is formed by a keyboard, a mouse, a touch panel key and etc. In response to an instruction keyed in by an operator, the input device 27 outputs an input signal $V_{IN}$ to the controller 26 or to the CPU part of the controller 26, to be more precise. The input signal $V_{IN}$ is a signal which provides information regarding the travel amount Δx of the punching unit 8 or the plate edge distance xd. Besides the input signal $V_{IN}$ the controller 26 receives output signals of the origin sensor 12, namely, an origin position detection signal $V_o$ and detection signals of the reflection type optical sensors 817 of the punching units 8A and 8B, or punching complete detection signals $V_{PA}$ and $V_{PB}$. The controller 26 supplies a first control signal (pulse signal) $V_M$ which controls the pulse motor 4 to a driver 24, and a second and a third control signals $V_A$ and $V_B$ which control the motors 81 of the punching units 8A and 8B to drivers 23 and 25, respectively. The drivers 23, 24 and 25 convert the signals $V_A$, $V_M$ and $V_B$ into (drive) signals $V_{DA}$, $V_{DM}$, and $V_{DB}$ which are suitable to drive the punching unit 8A, the motor 4 and the punching unit 8B, respectively.

Now, an operation of the punching transport apparatus 100 will be described in detail in reference to FIGS. 4, 5 and 7.

(1) First, the punching unit 8 is retrieved outside the effective drawing area, or more strictly describing, outside an effective drawing area 34 in the subscanning direction X. See FIG. 8A. In the present embodiment, the punching unit 8 is moved to the condition shown in FIG. 4, that is, to the origin position $P_0$. However, it is not always necessary to retrieve the punching unit 8 to the origin position $P_0$. Rather, the punching unit 8 may be retrieved to any position outside the effective drawing area 34. Still, considering subsequently necessary control of the punching transport apparatus 100, it is desirable to retrieve the punching unit 8 to the origin position $P_0$ from the beginning.

More particularly, in response to a start instruction signal $V_{ST}$ supplied by an operator through the input device 27, the controller 26 provides the driver 24 with the first control signal $V_M$ which has a level which is necessary to rotate the motor 4 in a reverse direction. As herein termed, "the reverse direction of the motor" is the direction of rotation for moving the punching unit 8 in a direction (−X), that is, back to the origin position $P_0$. As a result, the transport carriers 22A and 22B and the punching units 8A and 8B move in the direction (−X). The vane 14 of the transport carrier 22A then arrives at the recess 12a of the origin sensor 12. Here, as mentioned earlier, the controller 26 detects a change in the origin position detection signal $V_O$ and confirms arrival of the punching unit 8 to the origin position $P_0$. The controller 26 thereafter stops outputting the first control signal $V_M$ so that the punching unit 8 stops at the origin position $P_0$. In this condition, the sub position register plate 221 is at the position $P_{A0}$ as shown in FIG. 3.

(2) Upon completion of the retrieval above, the photosensitive material 19 is inserted and mounted onto the inner surface 2. More precisely, the photosensitive material 19 is inserted into the drum 1 along the inner surface 2 until an end 19a of the photosensitive material 19 (i.e., the end which is generally parallel to the circumferential direction Y or the end surface 40) contacts the sub position register plate 221A. At this stage, since the punching unit 8 is outside the effective drawing area 34, the photosensitive material 19 is inserted easily without obstruction by the punching unit 8. This feature is also advantageous in automatizing insertion of the photosensitive material 19 onto the inner surface 2.

Following this, the motor 4 is driven to move the sub position register plate 221A by a necessary amount in accordance with subsequent image drawing in the subscanning direction X so that the photosensitive material 19 is retrieved into the cylindrical inner surface drum 1 and registered therein. See the dashed-and-dotted line FIG. 3. Thus, in this embodiment, since the photosensitive material 19 is positioned by moving the sub position register plate 221A in the subscanning direction X, it is possible to accurately adjust the position of the photosensitive material 19 in the subscanning direction X.

When positional adjustment of the photosensitive material 19 is complete, the punching unit 8 is retrieved to the origin position $P_0$ again.

As shown in FIG. 4, the end portion of the photosensitive material 19 (i.e., the portion in which a hole 16 is punched through) projects beyond the end surface 40, and is locally on the brackets 9A and 9B of the transport units 5A and 5B and the bracket 3 of the motor 4.

Figure 8A:
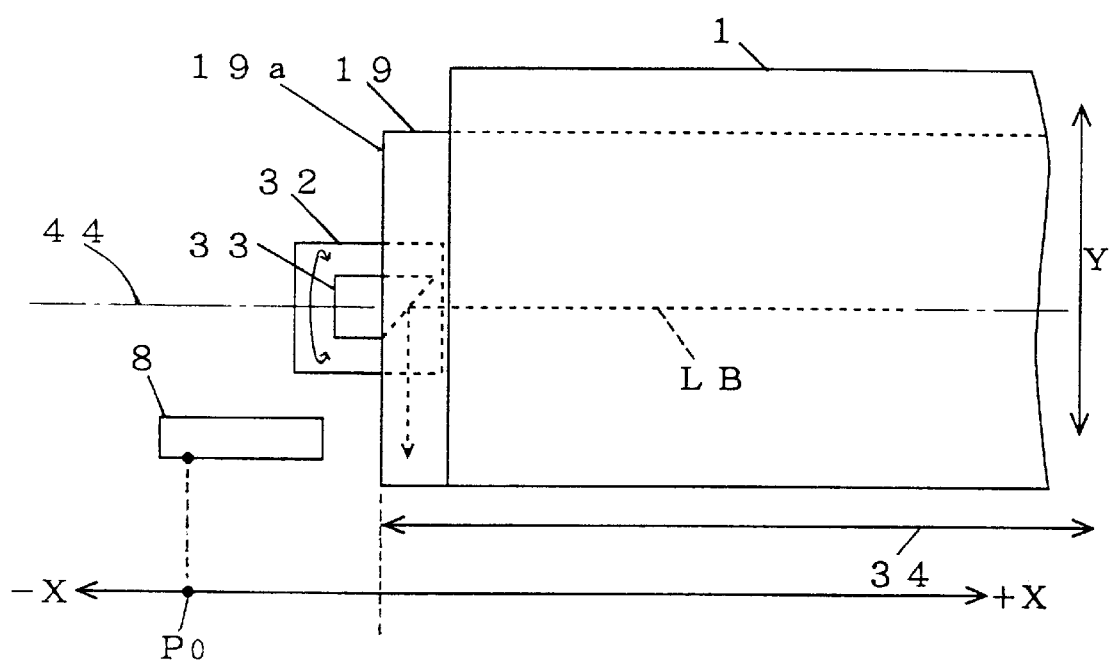
FIGS. 8A and 8B are side views of the punching unit of FIG. 2 as it is during exposure and as it is during punching, respectively.
Figure 8B:
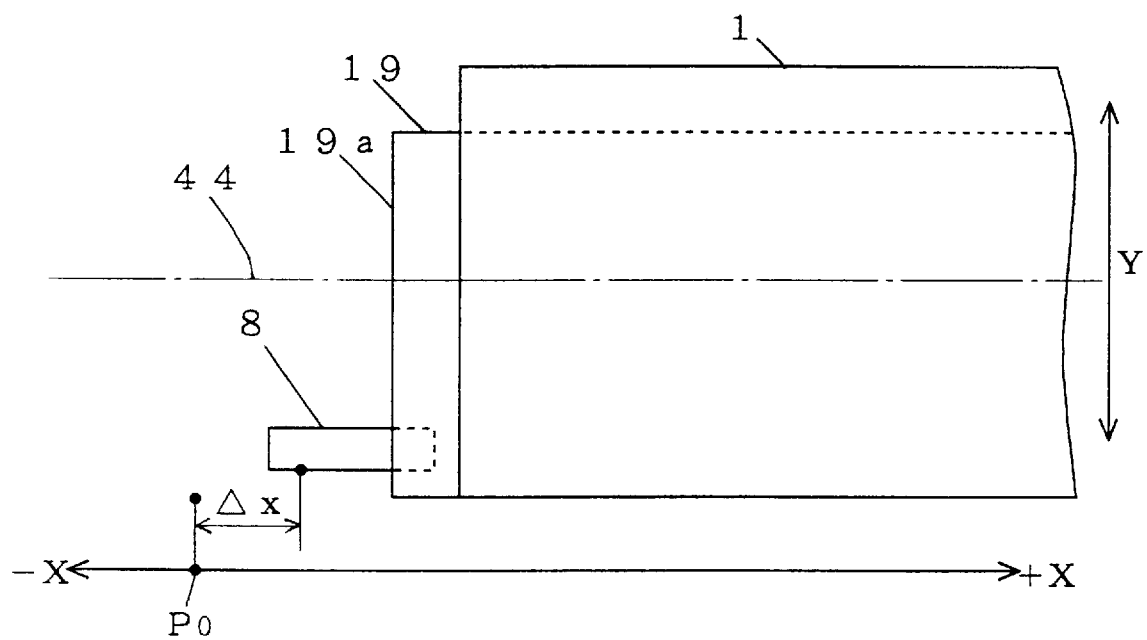
Figure 13A:
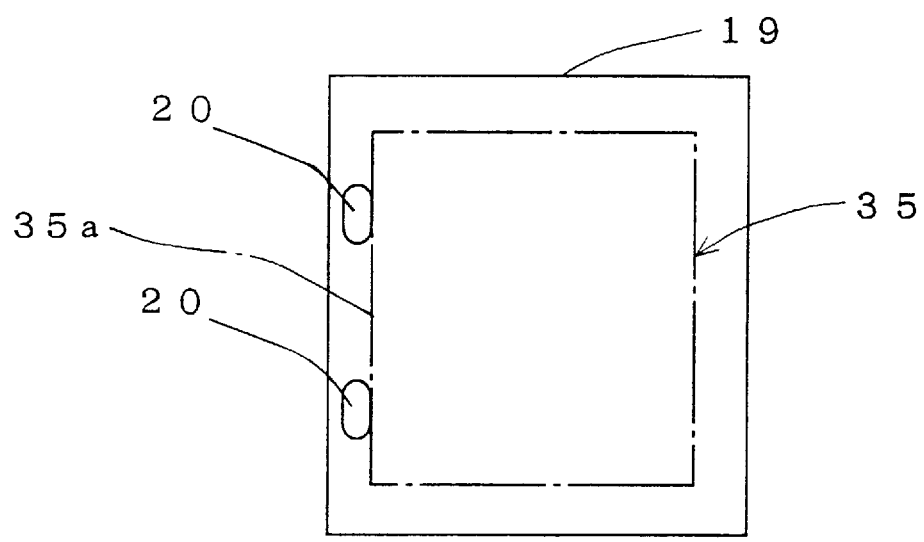
FIGS. 13A and 13B are plan views of exposure areas for different types of photosensitive materials.
Figure 13B:
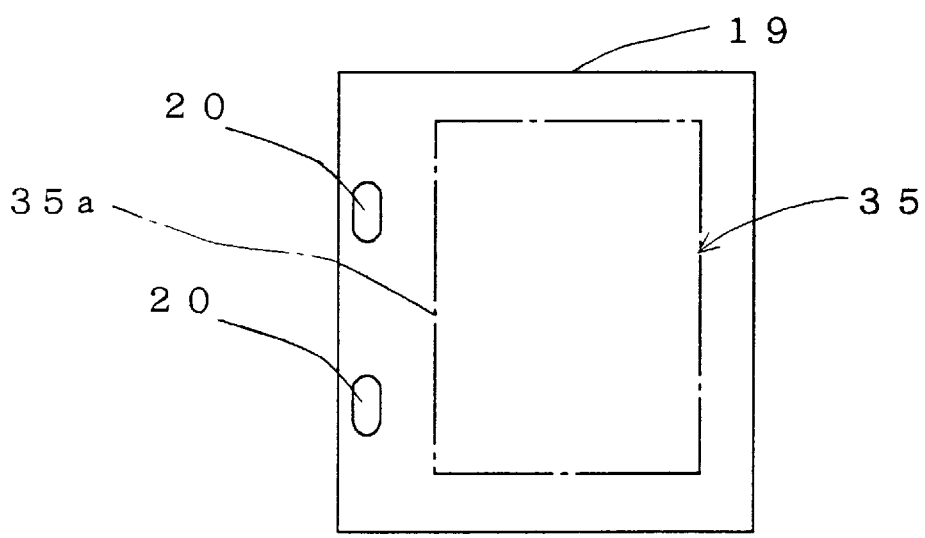

(3) After mounting the photosensitive material 19, image drawing is started. FIG. 8A schematically shows this condition. Like FIG. 8B, FIG. 8A shows the cylindrical inner surface drum 1 as viewed from the side, and corresponds to FIG. 2 as it is viewed from the direction of an arrow 43. As shown in FIG. 8A, since the punching unit 8 is at the origin position $P_0$, the punching unit 8 never obstructs travelling of the scanning head 32 in the central axis direction (subscanning direction) X. Hence, regardless of the type of the photosensitive material 19 (i.e., whether a business form sheet or an offset type sheet), it is possible to draw an image always within the effective drawing area 34, regarding both the main scanning direction and the subscanning direction. In other words, unlike in the conventional technique, the dead area 30 is not created in this embodiment. The range of the exposure area 35 is different depending on the type of the photosensitive material 19, as shown in FIGS. 13A and 13B, and is in the relation where effective drawing area 34≧exposure area 35. In FIG. 8A, indicated at 33 is a deflector which rotates about a central axis 44.

(4) Image drawing is followed by punching of holes. The punch 83 of the punch unit 8 is moved to a point above a predetermined punching position. As herein termed, "punching position" refers to a position on the end portion of the photosensitive material 19 which is inwardly away by "the plate edge distance xd," which is determined by the specifications of a printer which is used in later printing, from the end 19a of the photosensitive material 19, i.e., the end which is generally parallel to the circumferential direction Y or the end surface 40. See FIGS. 4 and 5.

First, through the input device 27, an operator provides the controller 26 with the travel amount Δx or the plate edge distance xd which is needed to move the punch 83 of the punch unit 8 to the punching position. That is, since the punching unit 8 is at the origin position $P_0$ at this stage, the travel amount Δx needed is given by (xF+xd) where xF is a distance between the punch 83 of the punch unit 8 at the origin position $P_0$ and the end 19a of the photosensitive material 19. See FIGS. 4 and 5. The distance xF is constant since the photosensitive material 19 is inserted and mounted in reference with a predetermined position in the inner surface 2. On the other hand, the plate edge distance xd is a constant value which is determined once the specifications of a printer are known. Hence, the travel amount Δx is also determined in relation with the specifications of the printer. This means that the travel amount Δx may be supplied as the input signal $V_{IN}$ or only the plate edge distance xd may be supplied.

Next, in accordance with the input signal $V_{IN}$, the controller 26, or the CPU part of the controller 26 to be more precise, reads a count number nH which corresponds to the travel amount Δx supplied by the input signal $V_{IN}$ from the memory part of the controller 26, and starts driving the counter part of the controller 26 and controlling the motor 4. That is, the controller 26 outputs the first control signal $V_M$, a pulse signal, to the motor 4 through the driver 24. Of course, at this stage, the level of the first control signal $V_M$ is such a level which rotates the motor 4 in a forward direction. As a result, the transport carriers 22A and 22B and the punching units 8A and 8B start moving in synchronism from the origin position $P_0$ in the direction +X. At the same time, the counter part of the controller 26 starts counting pulses of the first control signal $V_M$, and outputs a count nx to the CPU part. The count number nx corresponds to a travel amount x of the punching unit 8 up until to this time point. See FIG. 5. The CPU part compares the count nx with the previously registered count nH, and keeps outputting the first control signal $V_M$ as far as a relation nx<nH is satisfied. FIG. 5 shows this condition (Δx<xH) during travelling.

Detecting nx=NH, the controller 26 (or the CPU part) stops outputting the first control signal $V_M$. This stops the transport carriers 22A and 22B and the punching units 8 so that the punches 83 of the punching units 8 are registered with the punching positions, completing preparation for punching of holes. FIG. 8B schematically illustrates this condition.

The controller 26 outputs the second and the third control signals $V_A$ and $V_B$ to the motors 81 of the punching units 8A and 9B through the drivers 23 and 25, respectively, whereby the punches 83 are driven and the holes 20 are punched in the photosensitive material 19 at the punching positions. Completion of the punching of the holes 20 is detected by the sensors 87 of the punching units 8A and 8B as described earlier and outputted to the controller 26 as the punching complete detection signals $V_{PA}$ and $V_{PB}$.

(5) When the punching is complete, the punching units 8 are again returned or retrieved to the origin position $P_0$. This operation is the same as described in the paragraph (1).

(6) The photosensitive material 19 is removed upon retrieval of the punching unit to the origin position $P_0$.

(7) The operation described in the paragraph (1) is not necessary for next image drawing to a new photosensitive material 19 since the punching unit 8 is already at the origin position $P_0$. This allows to start the image drawing from the operation described in the paragraph (2). Here, in the operation described in the paragraph (4), when there is no change in the plate edge distance xd, the travel amount Δx or the plate edge distance xd may be inputted directly as the input signal $V_{IN}$. On the contrary, if there is a change in the plate edge distance xd due to a change in the specifications of a printer, a new travel amount Δx' or a new plate edge distance xd' is inputted directly as the input signal $V_{IN}$. As a result, the punching units 8A and 8B are moved until the punches 83 arrive at new punching positions which are determined by the new plate edge distance xd', and holes 20 are punched in at the new punching positions.

As described above, in this embodiment, the punching unit 8 is retrieved to the origin position $P_0$ and thereafter moved from the origin position $P_0$ in the central axis direction X under electric control based on the plate edge distance xd. This creates the following advantages. First, if an operator only inputs the input signal $V_{IN}$ in accordance with the plate edge distance xd, the punching unit 8 is automatically and accurately moved to a desired punching position under the control of the controller 26. As a result, a hole 20 is punched in exactly at the desire punching position. In addition, even when the plate edge distance xd is changed in relation with a subsequent printing process, an operator only has to change the value of the input signal $V_{IN}$ regardless of a change in the plate edge distance xd. That is, it is possible to punch a hole always at a desired punching position. Further, the punching unit 8 is automatically retrieved to the origin position $P_0$ during exposure. In other words, retrieval of the punching unit 8 is realized without any burden on an operator. Still further, it is possible to draw an image always within the effective drawing area 34 on any type of the photosensitive material 19.

Even further, since the transport units 5A and 5B are linked to each other using the pulleys 6A and 6B and the belts 7A and 7B, the two punching units 8A and 8B are moved respectively to desired punching positions at the same time and in synchronism to each other. Hence, travelling and retrieval of the punching units 8A and 8B are efficient.

In addition, having such a structure is attached to the end surface 40, the punching transport apparatus 100 can be attached to the end surface 40 outside the cylindrical inner surface drum 1, which is preferable in terms of operability. Of course, unlike in the conventional technique, there is no need to form a groove for fitting the punching unit 8 in the inner surface 2 of the cylindrical inner surface drum 1. In this respect as well, this embodiment is advantageous over the conventional technique in terms of a cost and operability. In addition, the punching transport apparatus 100 itself has a simple structure and is controlled using the pulse count, and therefore, the punching transport apparatus 100 is applicable to a practical and flexible use.

Figure 9:
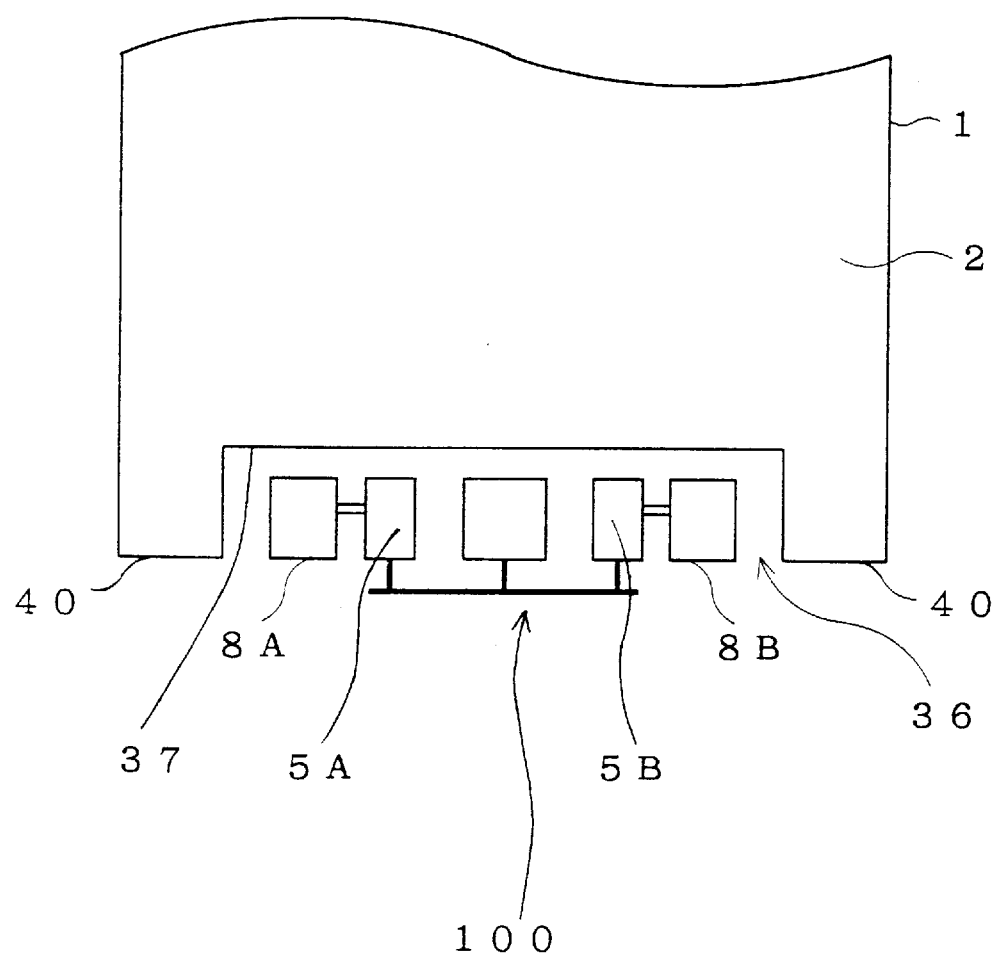
FIG. 9 is a plan view showing a modification of the present invention.
Figure 10:
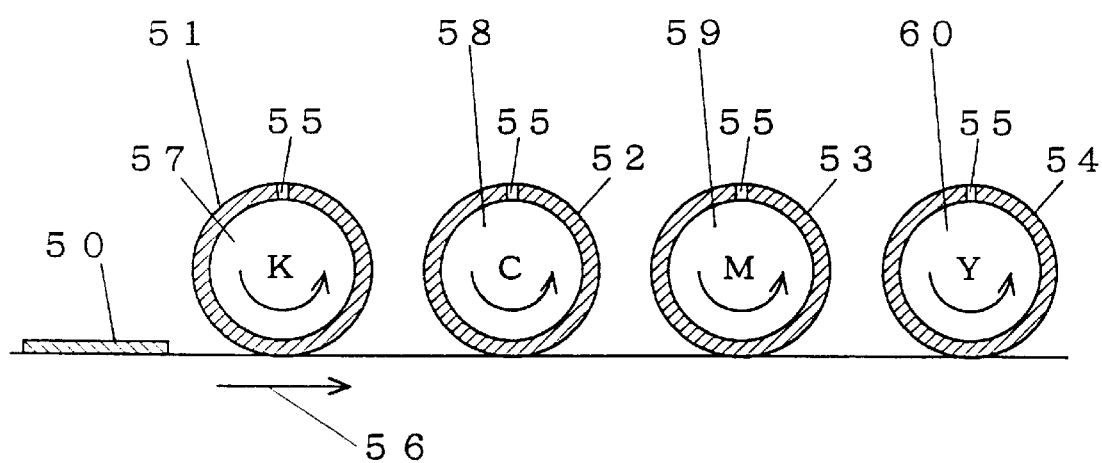
FIG. 10 is a schematic explanatory diagram of a printer.
Figure 11A:
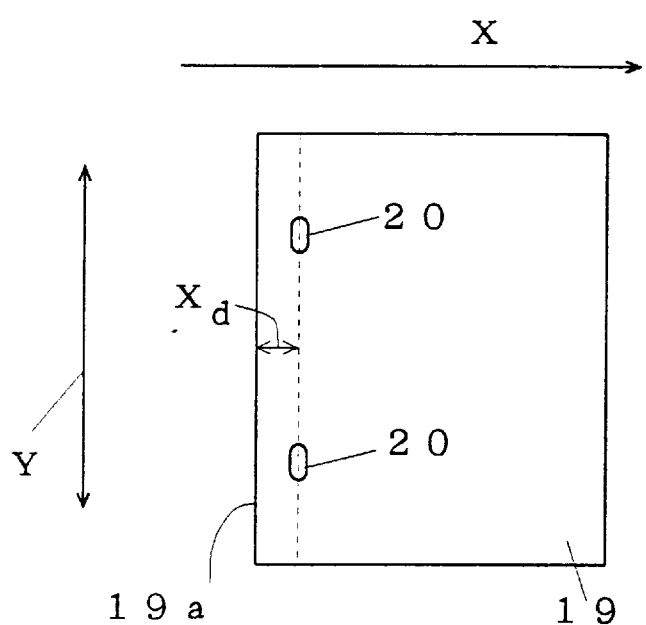
FIGS. 11A and 11B are plan views showing a plate edge distance.
Figure 11B:
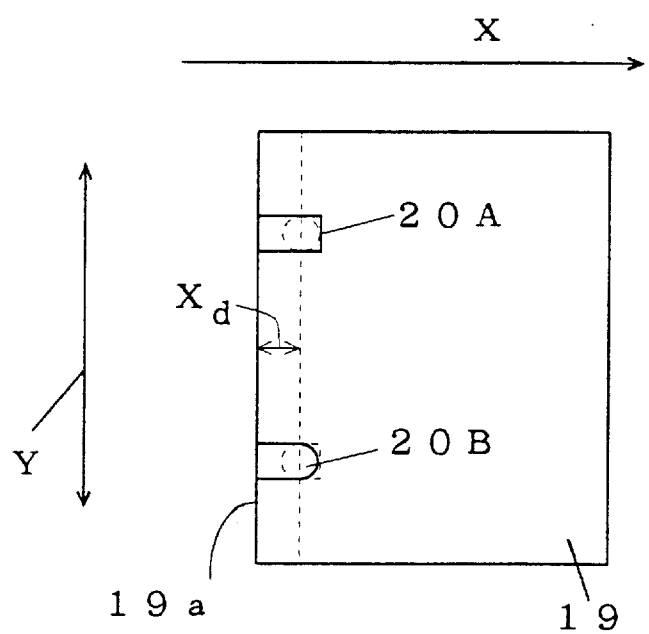
Figure 12:
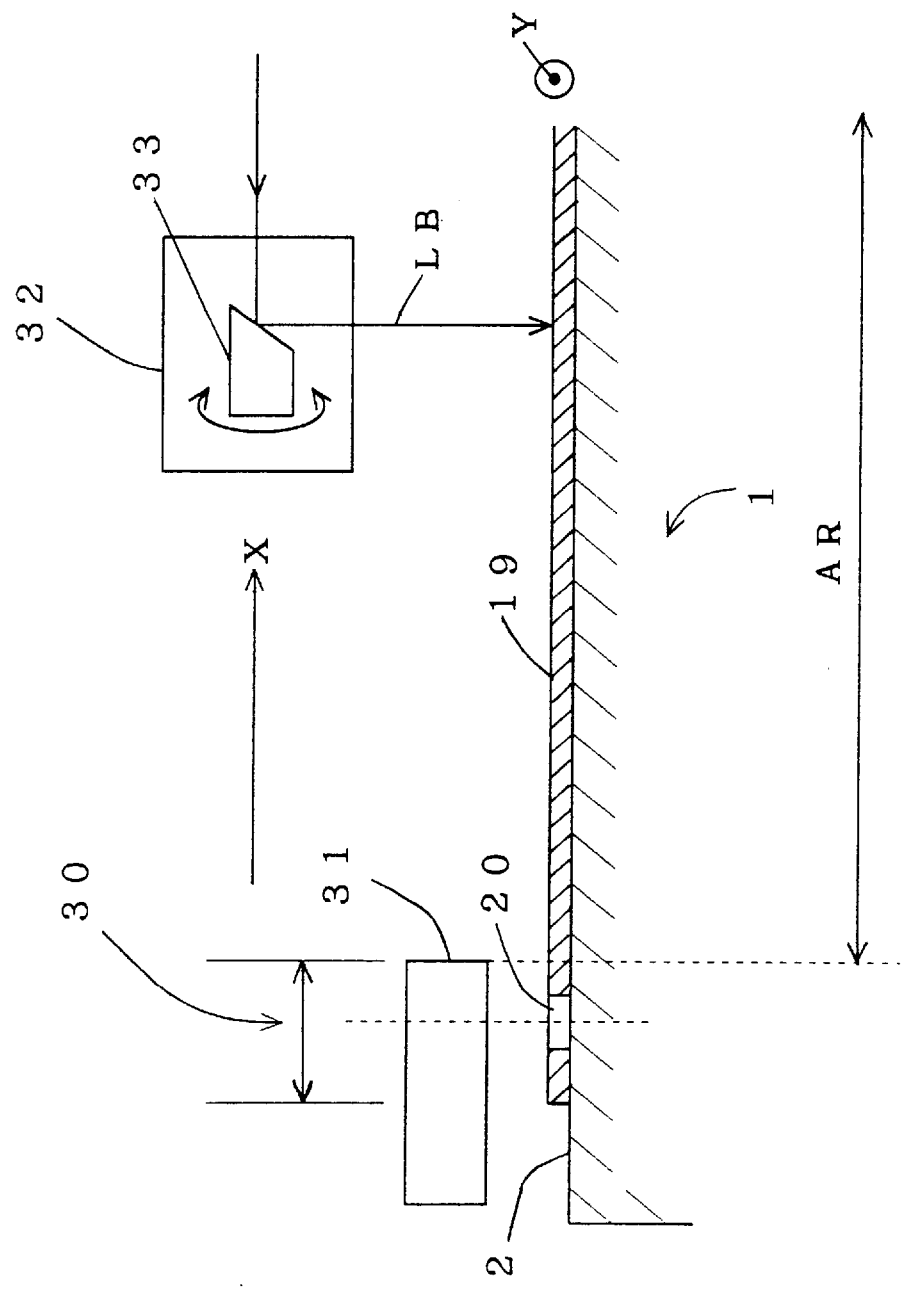
FIG. 12 is an explanatory diagram illustrating problems with a conventional technique.

Although the punching transport apparatus 100 is attached to the end surface 40 in the embodiment described above, the punching transport apparatus 100 may be disposed in the inner surface near the end surface 40, i.e., in an end portion of the cylindrical inner surface drum 1. In this case, a recess 36 is formed in the end portion as shown in the plan view in FIG. 9, and an apparatus which corresponds to the punching transport apparatus 100 is attached to a surface 37 of the recess 36.

Unlike the embodiment above wherein the two transport units 5A and 5B linked to each other are controlled in synchronism to each other, the transport units 5A and 5B may be controlled independently of each other without linking the transport units 5A and 5B to each other. Although four motors are necessary for each one of the transport units 5A and 5B in this modification, this modification can deal with a situation where the plate edge distance xd is different between two holes 20. Of course, only one motor 4 may be used to move three or more transport units which are linked to each other in synchronism to each other.

As other modifications, the transport units 5A and 5B and the punching units 8 may be controlled based on a measurement of a transportation time t instead of a pulse count of the first control signal $V_M$ as in the embodiment above. That is, where the travel speed of the punching unit 8 has a constant value v, the travel amount $\Delta x$ is $\Delta x = v \cdot t$. Therefore, by measuring a time elapsed from the start of travelling of the punching unit 8 by a timer installed in the controller 26 and by comparing a measured time with preliminary prepared data which define a relation between the travel amount $\Delta x$ and the elapsed time t, it is possible to detect that the punching unit 8 has moved the amount $\Delta x$ from the origin position $P_0$. Thus, control using a pulse count and control using the elapsed time t are the same. In the case of control using the elapsed time t, a DC motor or the like which continuously rotates may be used as the motor 4 instead of a pulse motor.

As described before, when the photosensitive material 19 is an offset type sheet, since holes 20 are sufficiently away from the exposure border of the exposure area 35, the punching unit 8 may not be retrieved back to the origin position $P_0$. In this case, when the plate edge distance xd is changed, it is necessary to adjust travelling of the punching unit 8 in accordance with the change in the plate edge distance xd.

Further, although holes are punched in after image drawing, punching of holes may be performed after mounting of a photosensitive material and before image drawing.

While the invention has been described in detail, the foregoing description is in all aspects illustrative and not restrictive. It is understood that numerous other modifications and variations can be devised without departing from the scope of the invention.

We claim:

1. A punching apparatus for use in a cylindrical inner surface scanner in which a scanning head is moved within an effective drawing area in a central axis direction of a cylindrical inner surface drum so that a light beam from said scanning head, which is modulated by an image signal, sweeps over an inner surface of said cylindrical inner surface drum in a circumferential direction of said cylindrical inner surface drum, thereby exposing a photosensitive material which is mounted on said inner surface and drawing an image on said photosensitive material, said punching apparatus comprising:

a punching unit including a punch for punching a hole in said photosensitive material;

punching unit transport means attached to an end portion of said cylindrical inner surface drum of said central axis direction, said punching unit transport means moving said punching unit in said central axis direction; and control means for controlling said punching unit transport means so that said punching unit is moved in said central axis direction in accordance with a plate edge distance, which is a distance between one end of said photosensitive material, which is approximately parallel to said circumferential direction, and a punching position which is determined in relation to a subsequent process, thereby registering said punch to said punching position.

2. The punching apparatus of claim 1, wherein said punching unit transport means is attached to an end surface of said cylindrical inner surface drum.

3. The punching apparatus of claim 1, wherein said punching unit transport means includes a drive source and a transport member which is linked to said punching unit, said transport member moving with said punching unit in said central axis direction when driven by said drive source.

4. The punching apparatus of claim 3, further comprising a position register plates which is fixed to said transport member to come into contact with an end of said photosensitive material which is mounted on said inner surface of said cylindrical inner surface drum, wherein said control means controls said drive source to move said position register plate in said central axis direction to push back said photosensitive material toward said cylindrical inner surface drum and thereby adjust a position of said photosensitive material.

5. The punching apparatus of claim 4, wherein said control means retrieves said position register plate outside said cylindrical inner surface drum after adjusting the position of said photosensitive material.

6. The punching apparatus of claim 1, wherein said control means moves said punching unit outside said effective drawing area during image drawing.

7. A punching apparatus for use in a cylindrical inner surface scanner in which a scanning head is moved within an effective drawing area in a central axis direction of a cylindrical inner surface drum so that a light beam from said scanning head, which is modulated by an image signal, sweeps over an inner surface of said cylindrical inner surface drum in a circumferential direction of said cylindrical inner surface drum, thereby exposing a photosensitive material which is mounted on said inner surface and drawing an image on said photosensitive material, said punching apparatus comprising:

punching unit including a punch for punching a hole in said photosensitive material;

a punching unit transport device attached to an end portion of said cylindrical inner surface drum of said central axis direction, said punching unit transport device moving said punching unit in said central axis direction; and a control device for controlling said punching unit transport device so that said punching unit is moved in said central axis direction in accordance with a plate edge distance, which is a distance between one end of said photosensitive material, which is approximately parallel to said circumferential direction, and a punching position which is determined in relation to a subsequent process, thereby registering said punch to said punching position.

8. The punching apparatus of claim 7, wherein said punching unit transport device is attached to an end surface of said cylindrical inner surface drum.

9. The punching apparatus of claim 7, wherein said punching unit transport device includes a drive source and a transport member which is linked to said punching unit, said transport member moving with said punching unit in said central axis direction when driven by said drive source.

10. The punching apparatus of claim 9, further comprising a position register plate, which is fixed to said transport member to come into contact with an end of said photosensitive material which is mounted on said inner surface of said cylindrical inner surface drum, wherein said control device controls said drive source to move said position register plate in said central axis direction to push back said photosensitive material toward said cylindrical inner surface drum and thereby adjust a position of said photosensitive material.

11. The punching apparatus of claim 10, wherein said control device retrieves said position register plate outside said cylindrical inner surface drum after adjusting the position of said photosensitive material.

12. The punching apparatus of claim 7, wherein said control device moves said punching unit outside said effective drawing area during image drawing.

\* \* \* \* \*